(12) United States Patent
Yoon

(10) Patent No.: US 6,686,286 B2
(45) Date of Patent: Feb. 3, 2004

(54) METHOD FOR FORMING A BORDERLESS CONTACT OF A SEMICONDUCTOR DEVICE

(75) Inventor: Jun Ho Yoon, Chungcheungbuk-do (KR)

(73) Assignee: Hynix Semiconductor Inc., Ichon (KR)

( * ) Notice: Subject to any disclaimer, the term of this patent is extended or adjusted under 35 U.S.C. 154(b) by 106 days.

(21) Appl. No.: 10/103,739

(22) Filed: Mar. 25, 2002

(65) Prior Publication Data

US 2002/0142606 A1 Oct. 3, 2002

(30) Foreign Application Priority Data

Mar. 28, 2001 (KR) .................................... 2001-16308

(51) Int. Cl.⁷ ............................................. H01L 21/302
(52) U.S. Cl. .................. 438/696; 438/618; 438/624; 438/625; 438/626; 438/627; 438/585
(58) Field of Search .................. 438/618, 624, 438/625, 626, 627, 585, 696

(56) References Cited

U.S. PATENT DOCUMENTS 6,207,514 B1 * 3/2001 Furukawa .................. 438/299
6,215,190 B1 * 4/2001 Bruce et al. ................ 257/774
6,228,777 B1 * 5/2001 Arafa et al. ................ 438/740
6,380,063 B1 * 4/2002 Chediak et al. ............ 438/621
2002/0100904 A1 * 8/2002 Ye et al. ...................... 257/10

* cited by examiner

Primary Examiner—George Goudreau
(74) Attorney, Agent, or Firm—Pillsbury Winthrop LLP

(57) ABSTRACT

A method for forming a borderless contact of a semiconductor device includes forming a gate electrode on a field oxide of the semiconductor substrate, patterning a stacked structure of a buffer layer and an etching barrier layer on sidewalls of the gate electrode and on the field oxide, forming a silicide layer on the gate electrode and an active region exposed by the stacked structure, and forming the borderless contacts to reduce or prevent leakage current between the semiconductor device and the metal lines and degradation resulting from stresses inherent in the prior art nitride etching barrier layer by reducing abnormal oxidation associated with the buffer oxide layer under the etching barrier layer.

14 Claims, 3 Drawing Sheets

METHOD FOR FORMING A BORDERLESS CONTACT OF A SEMICONDUCTOR DEVICE

This application relies for priority upon Korean Patent Application No. 2001-16308, filed on Mar. 28, 2001, the contents of which are herein incorporated by reference in their entirety.

FIELD OF THE INVENTION

The present invention relates to a method for forming a borderless contact for a semiconductor device and, more particularly, to a method for reducing deterioration of a device due to etching the field oxide in an isolation region when the contact pattern is misaligned by a significant margin during the process for forming the borderless contact holes.

BACKGROUND OF THE INVENTION

It is necessary to reduce the dimensions of both the device elements and the isolation regions between device elements in order to increase the integration density of a semiconductor device. Since the degree of reduction determines size of a cell, a memory cell size is greatly influenced by the device isolation technology.

Conventional methods for manufacturing a field oxide on the isolation region such as "Local Oxidation of Silicon" ("LOCOS"), in which active regions are typically separated by isolation materials grown from the substrate; "Poly-Buffered LOCOS" ("PBL"), in which a stacked structure of an oxide layer, a polycrystalline silicon layer, a nitride layer is formed on silicon substrate; and a trench technique, in which a trench is formed in a silicon substrate and then filled with an insulator are known in the art.

Recently, however, a shallow trench isolation (STI) technique has been used more frequently to form a field oxide in the isolation region.

However, when a borderless contact is formed on a substrate, the insulating material filling the trench, i.e., the field oxide, may be damaged due to a misalignment during the following contact etching step, causing deterioration of semiconductor device characteristics.

A method for forming a borderless contact in a semiconductor device (not shown) is as follows:

First, a field oxide and a gate electrode are sequentially formed on a substrate and an insulation film spacer is then formed on sidewalls of the gate electrode. A silicide layer is then formed on the top of the gate electrodes and in active regions of the semiconductor substrate. A nitride layer, or a stacked structure including a buffer oxide layer/nitride layer arrangement, is then deposited on the substrate to protect the field oxide from damage. An interlayer insulation film is then formed on the whole surface and selectively removed to form borderless contacts that exposes a boundary region between the silicide layer and the field oxide on the active region.

When only the nitride layer is used to prevent the field oxide from being damaged, voids in the silicide layer are created by a lattice constant difference between the nitride layer and the silicide layer under the nitride layer. As a result, the semiconductor device characteristics may be degraded by stresses induced in the nitride layer.

On the other hand, when using the buffer oxide/nitride layer structure, oxygen penetrates into the active region before formation of the silicide layer, resulting in silicide layer that includes oxygen atoms. As a result, during formation of the buffer oxide layer, the oxygen in the silicide layer out-diffuses and produces a deposited buffer oxide layer about 100 Å thicker than desired due to the reaction of the oxygen with the silane ($SiH_4$) used during the deposition process (i.e., an abnormal oxidation). Such an abnormal oxidation damages the field oxide as a result of the difference in thickness between the buffer oxide layer in the active region and the layers on the surface of the field oxide when the stacked layers are removed from the substrate after opening the borderless contact. Moreover, the abnormal oxidation may generate a contact-open failure in the resulting semiconductor device.

As described above, in the conventional method for forming a borderless contact, it is difficult to fill the borderless contact hole as a result of the damage to the field oxide during the borderless contact process etch. It also can create current leakage paths in the field oxide on the isolation region during a connection process with metal lines. As a result, the function and reliability of the semiconductor device will be degraded by the voids in the underlying silicide layer and by the abnormal oxidation that may generate a contact-open fail in the semiconductor device during the borderless contact process.

SUMMARY OF THE INVENTION

The object of the present invention is to provide a method for forming a borderless contact that minimizes deterioration of the device characteristics by forming a nitride film or a stacked structure of a buffer layer and a nitride film to reduce a damage to the field oxide, and then forming a silicide layer by exposing only the layer on which the silicide layer is deposited.

According to an aspect of the present invention, the method for forming a borderless contact for a semiconductor including a field oxide defining an active region, comprising the steps of: forming a gate electrode on the field oxide of the semiconductor device; forming a stacked structure of a buffer layer pattern and an etching barrier layer pattern on sidewalls of the gate electrode and on the field oxide; forming a silicide layer on the surface of the gate electrode and on the active region which are exposed through the stacked structure; and forming a borderless contact hole.

According to another aspect of the present invention, the method for forming a borderless contact of a semiconductor device, comprising the steps of: forming a field oxide defining an active region on a semiconductor substrate; forming a gate electrode on the field oxide; forming a stacked structure comprising a buffer layer and an etching barrier layer on a whole surface of the semiconductor substrate, including the gate electrode; forming a photoresist pattern which exposes the stacked structure on the gate electrode and on an upper surface of the active region; anisotropically etching the exposed stacked structure using the photoresist pattern as a mask to expose an upper surface of the gate electrode and the upper surface of the active region, and removing the photoresist pattern; forming a silicide layer on the upper surface of the gate electrode and the upper surface of the active region where the stacked structure has been removed; forming a first interlayer insulation film on the whole surface; forming a second interlayer insulation film on the first interlayer insulation film; forming a third interlayer insulation film on the second interlayer insulation film; and forming a borderless contact hole by selectively etching the third, the second, and the first interlevel insulation layers using a contact etch mask to expose a portion of the gate electrode and a portion of the active region.

BRIEF DESCRIPTION OF THE DRAWINGS

The present invention will be more clearly understood from the following description with reference to the accompanying drawings, wherein.

DESCRIPTION OF THE PREFERRED EMBODIMENT

Referring to FIGS. 1 to 5, an embodiment of the present invention will be described below.

Figure 1:
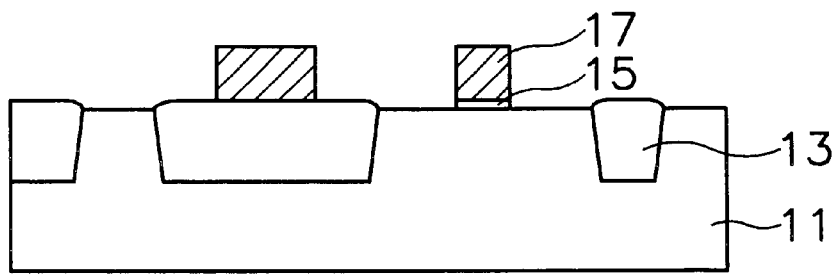
FIGS. 1 and 5 are cross-sectional views illustrating a method for forming a borderless contact of a semiconductor device in accordance with the present invention.
Figure 5:
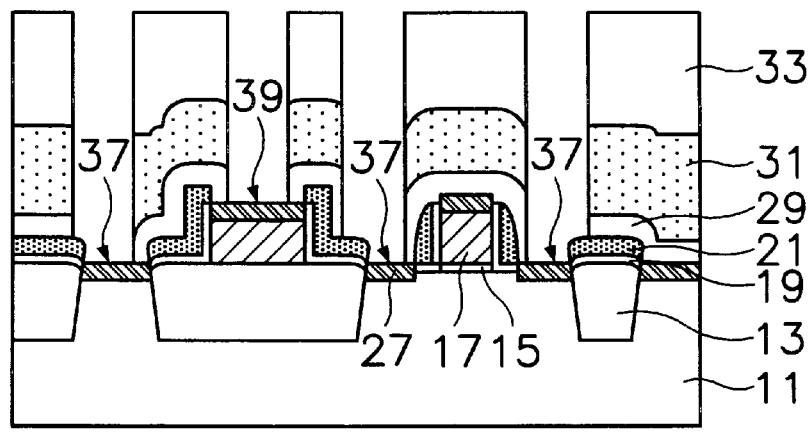

FIGS. 1 and 5 are cross-sectional views illustrating a method for forming a borderless contact of a semiconductor device in accordance with an embodiment of the present invention.

Referring to FIG. 1, a field oxide 13 defining an active region on a semiconductor substrate 11 is formed. The field oxide 13 is produced by forming a pad oxide film (not shown) and a pad nitride film (not shown) on the substrate 11. The pad oxide and pad nitride films are then patterned and etched using an isolation mask (not shown) to expose portions of the substrate 11. The exposed portions of substrate 11 are then etched to form a trench by using the patterned layers as an etching mask. The trench is then filled with an oxide layer and then the wafer is planarized. Typically, the oxide film is formed using a high density plasma chemical vapor deposition process. The planarizing step can be performed by chemical-mechanical polishing (CMP) using the pad nitride film as a target. The CMP process is performed to have a target that is higher than that of a conventional technology in order to minimize the damage on the pad nitride film. Although CVD deposition is typical, the oxide film filling the trench can be formed using other well-known methods of forming oxide films.

Gate electrodes including a gate oxide 15 and a polysilicon 17 are then formed on the surface of the semiconductor substrate 11. The gate oxide layer is formed by thermally oxidizing the whole surface of the substrate to a predetermined thickness and depositing a polysilicon layer to a predetermined thickness on the gate oxide layer. A photoresist pattern is then formed on the polysilicon using a gate electrode mask (not shown) and etched to form the gate electrodes comprising gate oxide 15 and polysilicon 17.

The FIG. 1 is a cross-sectional view illustrating gate electrodes formed respectively on an active region and an isolation region.

Figure 2:
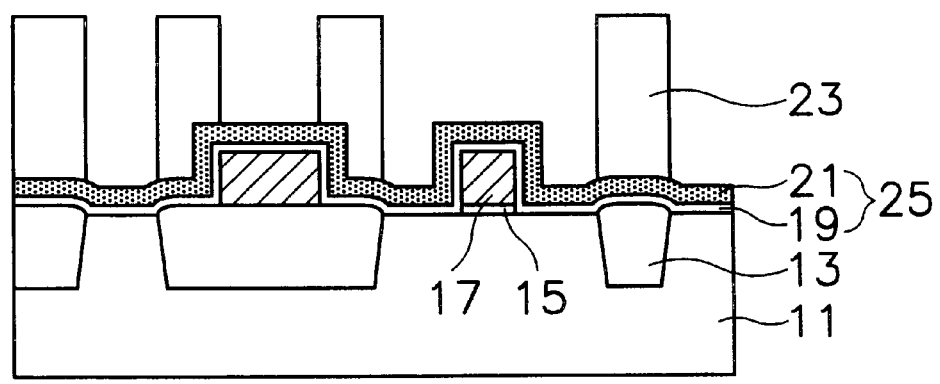

Referring to FIG. 2, after forming the structure illustrated in FIG. 1, a buffer oxide layer 19, that will serve as a buffer layer, and a nitride layer 21, that will serve as an etching barrier layer, are sequentially formed to a predetermined thickness on the whole surface. The buffer oxide layer 19 and the nitride layer 21 are preferably deposited to a thickness of about 100 to 200 Å and about 500 to 1000 Å, respectively. A first photoresist pattern 23 is then formed on the stacked structure of layers 19 and 21. The first photoresist pattern is formed to expose the entire active region and an upper portion of the gate electrode formed on field oxide 13 while protecting more narrow field oxide regions. As a result, the first photoresist pattern 23 is covers the field oxide 13 and exposes the upper side of the gate electrodes on the field oxide 13.

Figure 3:
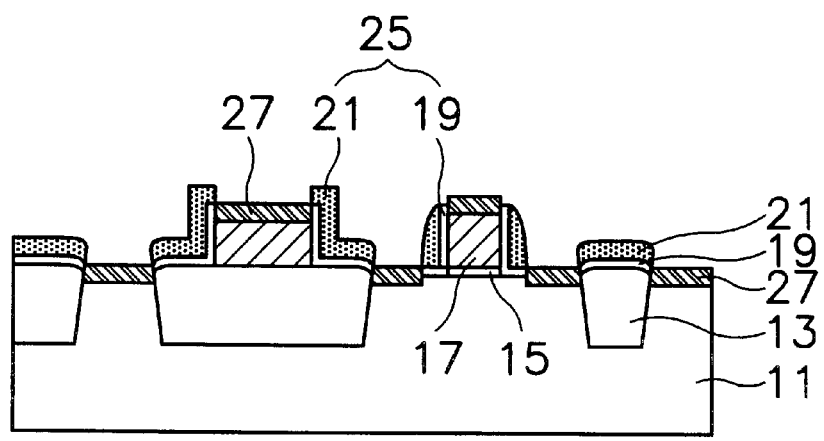

Referring to FIG. 3, the stacked structure of the buffer oxide 19 and the nitride 21 is then etched anisotropically using the first photoresist pattern 23 as a mask, and then the first photoresist pattern 23 is removed. As a result, an insulation layer spacer 25, comprising a stacked structure of layers 19 and 21 is formed on the sidewalls of the gate electrodes and on the upper surface of the exposed portions of the field oxide 13.

Here, the anisotropic etching process is preferably performed under a pressure of about 1000 to 1500 mTorr, and at a power of about 500 to 800 watts. The anisotropic etching process is performed using $CHF_3$ with flow rate 30 to 50 sccm, $CF_4$ of flow rate 70 to 100 sccm, and Ar of flow rate of 800 to 1500 sccm. The etching process using difference in etch selectivity ratio between the substrate 11 and the stacked structure to perform the etching process minimizes the damage on the substrate 11.

Then, the photoresist pattern 23 is removed by ashing and wet cleaning, the cleaning process also removing a polymer (not shown) that is formed during the etching process.

A silicide layer 27 is then formed on the exposed portions of the active region of the substrate and the exposed surfaces of those portions of the polysilicon layer 17 in the active region and above the field oxide 13 in the isolation regions.

At this time, the silicide layer 27 is formed from a metal having high melting point, preferably cobalt, titanium, or tungsten.

Figure 4:
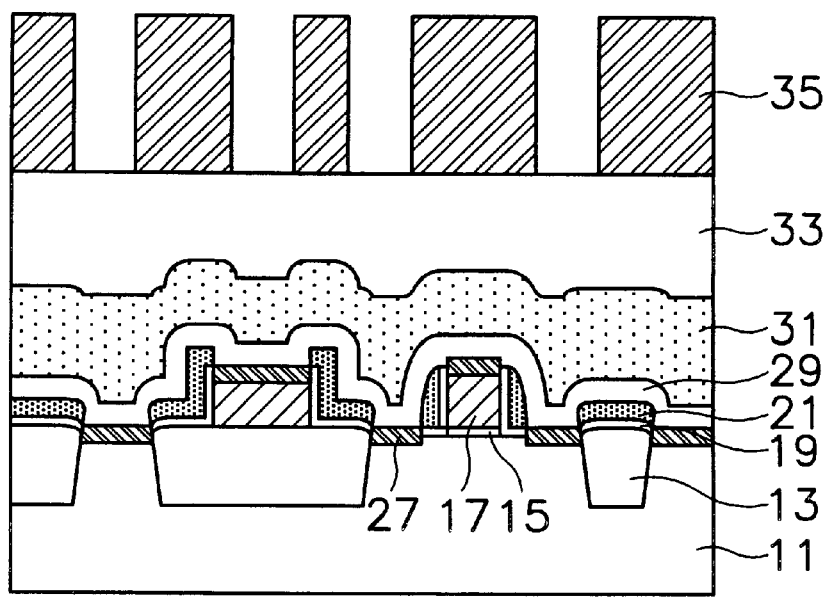

Referring to FIG. 4, a first interlayer insulation film 29 is then formed to a thickness of about 500 to 1500 Å to prevent penetration of moisture or mobile ions. A second interlayer insulation film 31 for preventing moisture penetration and for gathering mobile ions is then formed on the first interlayer insulation film 29. The second interlayer insulation film 31 is preferably formed from a borophosphosilicate glass (BPSG) layer to a thickness of about 3000 to 4000 Å.

Next, a third interlayer insulation film 33, preferably a tetraethyl orthosilicate (TEOS) oxide layer, is formed using plasma enhanced chemical vapor deposition (PECVD). The third interlayer insulation film 33 is deposited to a thickness of about 10,000 to 15,000 Å, and is then planarized.

The total thickness of the first interlayer insulation film 29, second interlayer insulation film 31, and the planarized third interlayer insulation film 33 can range from about 4000 to about 8000 Å.

After the third interlayer insulation film 33 has been deposited and planarized, a second photoresist pattern 35 is formed to a thickness of about 5000 to 8000 Å on the upper side of the third interlayer insulation film 33. The second photoresist pattern 35 is formed using a metal contact mask (not shown), the contact hole of which is preferably designed to be about 0.20 to 0.35 $\mu$m in size.

Referring to FIG. 5, a contact hole is etched through the third interlayer insulation film 33, the second interlayer insulation film 31, and first interlayer insulation film 29. At the completion of the etching process, a first contact hole 37, exposing the silicide layer 27 located on the active region of the substrate 11, and a second contact hole 39, exposing the silicide layer 27 on the gate electrode, have been formed.

The etching process is preferably performed using equipment having middle ion density under the conditions, including a pressure of 30 to 100 mTorr, a top electrode voltage of 1800 to 2400 watts, and a bottom electrode voltage of 1500 to 2000 watts, with the flow rates of $C_4F_8$, $O_2$, and Ar being about 10 to 20 sccm, 5 to 15 sccm, and 300 to 600 sccm, respectively.

The etching process is also performed by increasing temperature of cathode electrode within the equipment by 1 to 20° C. It is possible that the polymer (not shown) formed during the etching processing can be deposited on a bottom of the contact hole, rather than on sidewalls of the contact hole. Hence, the difference in the etch selectivity ratio between the first, second, and third interlayer insulation film 29, 31, and 33, and the etching barrier layer 21, becomes greater than 10, so that the etching can be stopped at the nitride layer 21 and therefore serves as an etching barrier.

Then, the second photoresist pattern 35 is removed using oxygen plasma ashing techniques, and the substrate 11 is chemically treated using amine series in order to remove a remaining polymer after the etching process used to form the contact holes.

After that, contact plugs (not shown) are formed to fill the contact holes 37 and 39, and metal lines (not shown) are formed and connected to the contact plugs to complete a borderless contact. A titanium layer for use as a junction layer is formed with a thickness of 50 to 150 Å on the surface of the first contact hole 37 and second contact hole 39, after which the contact holes are filled with tungsten to form the contact plugs.

As described above, the method for forming a borderless contact of a semiconductor device in accordance with the present invention is as follows. Instead of interposing an etching barrier layer between a silicide layer and an interlevel insulation layer, a polysilicon is interposed between them to form a gate electrode. By adding a mask process to a process for an insulation layer spacer on the sidewalls, an etching barrier layer is formed on a field oxide. It can prevent leakage current between the semiconductor device and the metal lines and deterioration by stresses of the nitride layer as the etching barrier layer. Therefore, a problem of an abnormal oxidation involved in the buffer oxide layer under the etching barrier layer can be solved.

What is claimed is:

1. A method for forming a borderless contact for a semiconductor device including a field oxide defining an active region, comprising the steps of:

forming a gate electrode on the field oxide of the semiconductor device;

forming a stacked structure of a buffer layer pattern and an etching barrier layer pattern on sidewalls of the gate electrode and on the field oxide;

forming a silicide layer on the surface of the gate electrode and on the active region which are exposed through the stacked structure; and forming a borderless contact hole.

2. The method for forming a borderless contact for a semiconductor device according to claim 1:

wherein the silicide layer comprises silicon reacted with cobalt or titanium.

3. A method for forming a borderless contact of a semiconductor device, comprising the steps of:

forming a field oxide defining an active region on a semiconductor substrate;

forming a gate electrode on the field oxide;

forming a stacked structure comprising a buffer layer and an etching barrier layer on a whole surface of the semiconductor substrate, including the gate electrode;

forming a photoresist pattern which exposes the stacked structure on the gate electrode and on an upper surface of the active region;

anisotropically etching the exposed stacked structure using the photoresist pattern as a mask to expose an upper surface of the gate electrode and the upper surface of the active region, and removing the photoresist pattern;

forming a silicide layer on the upper surface of the gate electrode and the upper surface of the active region where the stacked structure has been removed;

forming a first interlayer insulation film on the whole surface;

forming a second interlayer insulation film on the first interlayer insulation film;

forming a third interlayer insulation film on the second interlayer insulation film; and forming a borderless contact hole by selectively etching the third, the second, and the first interlevel insulation layers using a contact etch mask to expose a portion of the gate electrode and a portion of the active region.

4. The method for forming a borderless contact of a semiconductor device according to claim 3:

wherein the buffer layer comprises an oxide film having a thickness of about 100 to 200 Å.

5. The method for forming a borderless contact of a semiconductor device according to claim 3:

wherein the etching barrier layer comprises a nitride layer having a thickness of 500 to 1000 Å.

6. The method for forming a borderless contact of a semiconductor device according to claim 3:

wherein the step of anisotropically etching the exposed stacked structure further comprises a plasma etch at a pressure of 1000 to 1500 mTorr and with an applied power of 50 to 800 watts.

7. The method for forming a borderless contact of a semiconductor device according to claim 3:

wherein the step of anisotropically etching the exposed stacked structure further comprises introducing etching gases comprising $CHF_3$ at a flow rate of 30 to 50 sccm, $CF_4$ at a flow rate of 70 to 100 sccm, and Ar at a flow rate of 800 to 1500 sccm in to a plasma etch chamber.

8. The method for forming a borderless contact of a semiconductor device according to claim 3:

wherein the silicide layer comprises silicon reacted with cobalt or titanium.

9. The method for forming a borderless contact of a semiconductor device according to claim 3:

wherein the first interlayer insulation film comprises a thermal oxide layer having a thickness of 500 to 1500 Å.

10. The method for forming a borderless contact of a semiconductor device according to claim 3:

wherein the second interlayer insulation film comprises a borophosphosilicate glass (BPSG) insulation film having a thickness of 3000 to 4000 Å.

11. The method for forming a borderless contact of a semiconductor device according to claim 3:

wherein the third interlayer insulation comprises a plasma enhanced chemical vapor deposition (PECVD) oxide layer having a thickness of 10,000 to 15,000 Å.

12. The method for forming a borderless contact of a semiconductor device according to claim 3:

wherein the step of opening a borderless contact hole by selectively etching the third, the second, and the first interlevel insulation layers is performed under an etch condition that achieves an etching selectivity ratio of at least 10 between the first, second, and third interlevel insulation layers and the etching barrier layer.

13. The method for forming a borderless contact of a semiconductor device according to claim 3:

wherein the step of opening a borderless contact hole by selectively etching the third, the second, and the first interlevel insulation layers is performed in equipment having middle ion density under conditions comprising a pressure of 30 to 100 mTorr,
a top electrode power of 1800 to 2400 watts,
a bottom electrode power of 1500 to 2000 watts,
a $C_4F_8$ flowrate of 10 to 20 sccm,
an $O_2$ flowrate of 5 to 15 sccm, and
an Ar flowrate of 300 to 600 sccm.

14. The method for forming a borderless contact of a semiconductor device according to claim 3:

wherein the step of opening a borderless contact hole by selectively etching of the third, the second, and the first interlevel insulation layers further comprises increasing a temperature of a cathode electrode in the equipment by 1 to 20° C.

* * * * *